United States Patent
Sriram (10) Patent No.: US 12,142,674 B2
(45) Date of Patent: Nov. 12, 2024

(54) GALLIUM NITRIDE HIGH-ELECTRON MOBILITY TRANSISTORS WITH P-TYPE LAYERS AND PROCESS FOR MAKING THE SAME

(71) Applicant: WOLFSPEED, INC., Durham, NC (US)

(72) Inventor: Saptharishi Sriram, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 17/859,425

(22) Filed: Jul. 7, 2022

(65) Prior Publication Data
US 2022/0344500 A1    Oct. 27, 2022

Related U.S. Application Data

(63) Continuation of application No. 15/192,545, filed on Jun. 24, 2016, now Pat. No. 11,430,882.

(51) Int. Cl.
*H01L 29/778* (2006.01)
*H01L 21/265* (2006.01)
(Continued)

(52) U.S. Cl.
CPC .... *H01L 29/7783* (2013.01); *H01L 21/26546* (2013.01); *H01L 21/3228* (2013.01);
(Continued)

(58) Field of Classification Search
CPC ............. H01L 29/7783; H01L 29/2003; H01L 29/66462; H01L 29/7786; H01L 29/0623
See application file for complete search history.

(56) References Cited

U.S. PATENT DOCUMENTS 5,289,015 A * 2/1994 Chirovsky .............. G02F 3/028
                                                         257/E27.128
5,318,915 A * 6/1994 Baliga ................... H01L 21/046
                                                         257/E21.057
(Continued)

FOREIGN PATENT DOCUMENTS

CN         1717811              1/2006
CN       102623493 A             8/2012
(Continued)

OTHER PUBLICATIONS

Pal et al. "High electron Mobility transistor" IJSRET, vol. 1, issue. 1, Mar. 2012, pp. 043-046 (Year: 2012).
(Continued)

*Primary Examiner* — John A Bodnar
(74) *Attorney, Agent, or Firm* — BakerHostetler (57) ABSTRACT

A high-electron mobility transistor includes a substrate layer, a first buffer layer provided on the substrate layer, a barrier layer provided on the first buffer layer, a source provided on the barrier layer, a drain provided on the barrier layer, and a gate provided on the barrier layer. The transistor further includes a p-type material layer having a length parallel to a surface of the substrate layer over which the first buffer layer is provided, the length of the p-type material layer being less than an entire length of the substrate layer. The p-type material layer is provided in one of the following: the substrate layer, or the first buffer layer. A process of making the high-electron mobility transistor is disclosed as well.

32 Claims, 6 Drawing Sheets

(51) Int. Cl.
   *H01L 21/322* (2006.01)
   *H01L 29/16* (2006.01)
   *H01L 29/66* (2006.01)
   *H01L 29/20* (2006.01)

(52) U.S. Cl.
   CPC .... *H01L 29/1608* (2013.01); *H01L 29/66068* (2013.01); *H01L 29/66431* (2013.01); *H01L 29/2003* (2013.01)

(56) References Cited

U.S. PATENT DOCUMENTS

| | | | |
|---|---|---|---|
| 6,639,277 | B2 | 10/2003 | Rumennik et al. |
| 6,956,239 | B2 | 10/2005 | Sriram |
| 7,646,043 | B2 | 1/2010 | Sriram et al. |
| 7,696,566 | B2 | 4/2010 | Disney |
| 7,812,369 | B2 | 10/2010 | Chini et al. |
| 8,698,162 | B2 | 4/2014 | Lee et al. |
| 8,759,879 | B1 | 6/2014 | Tipirneni et al. |
| 8,890,211 | B1* | 11/2014 | Mayo ............... H01L 21/28593 257/E21.403 |
| 8,901,609 | B1 | 12/2014 | Chen et al. |
| 9,337,332 | B2 | 5/2016 | Chu et al. |
| 9,484,862 | B2 | 11/2016 | De Rooij et al. |
| 9,621,153 | B2 | 4/2017 | Ikeda et al. |
| 10,290,730 | B1 | 5/2019 | Yang et al. |
| 2002/0066960 | A1 | 6/2002 | Ring |
| 2003/0141518 | A1 | 7/2003 | Yokogawa et al. |
| 2004/0099888 | A1 | 5/2004 | Sriram |
| 2004/0124435 | A1* | 7/2004 | D'Evelyn ............ H01L 21/0254 257/E29.189 |
| 2004/0149993 | A1 | 8/2004 | McClure et al. |
| 2004/0201037 | A1 | 10/2004 | Fareed et al. |
| 2005/0121694 | A1 | 6/2005 | Mun et al. |
| 2005/0224809 | A1 | 10/2005 | Sriram |
| 2006/0125001 | A1 | 6/2006 | Sriram |
| 2007/0051977 | A1 | 3/2007 | Saito et al. |
| 2007/0059873 | A1* | 3/2007 | Chini ............... H01L 29/40117 257/E21.177 |
| 2007/0246713 | A1 | 10/2007 | Arnold et al. |
| 2007/0292999 | A1 | 12/2007 | Henning et al. |
| 2008/0315257 | A1 | 12/2008 | Shiraishi |
| 2009/0120924 | A1 | 5/2009 | Moffatt et al. |
| 2010/0084742 | A1 | 4/2010 | Sazawa et al. |
| 2011/0215338 | A1 | 9/2011 | Zhang |
| 2011/0260174 | A1 | 10/2011 | Hebert |
| 2012/0068227 | A1 | 3/2012 | Hikita et al. |
| 2012/0153300 | A1 | 6/2012 | Lidow et al. |
| 2012/0187451 | A1* | 7/2012 | Saito ..................... H01L 29/808 257/192 |
| 2012/0217511 | A1 | 8/2012 | Renaud et al. |
| 2012/0319127 | A1 | 12/2012 | Chowdhury et al. |
| 2013/0049014 | A1 | 2/2013 | Aigo et al. |
| 2013/0062671 | A1 | 3/2013 | Saito et al. |
| 2013/0153967 | A1 | 6/2013 | Curatola et al. |
| 2013/0221320 | A1 | 8/2013 | Li et al. |
| 2014/0117381 | A1 | 5/2014 | Kang et al. |
| 2014/0253241 | A1 | 9/2014 | Lee et al. |
| 2014/0264379 | A1 | 9/2014 | Kub et al. |
| 2014/0264960 | A1 | 9/2014 | Ring et al. |
| 2015/0028345 | A1 | 1/2015 | Wong et al. |
| 2015/0028350 | A1 | 1/2015 | Suvorov et al. |
| 2015/0145032 | A1 | 5/2015 | Quay et al. |
| 2015/0236146 | A1 | 8/2015 | Liu et al. |
| 2015/0318387 | A1 | 11/2015 | Chiu et al. |
| 2015/0349117 | A1* | 12/2015 | Chu .................. H01L 29/7786 438/270 |
| 2015/0372124 | A1 | 12/2015 | Isobe et al. |
| 2016/0035870 | A1 | 2/2016 | Wu et al. |
| 2016/0071967 | A1 | 3/2016 | Prechtl et al. |
| 2016/0086878 | A1 | 3/2016 | Otremba et al. |
| 2016/0293709 | A1 | 10/2016 | Nakayama et al. |
| 2016/0351567 | A1 | 12/2016 | Schmid |
| 2017/0018638 | A1 | 1/2017 | Teo et al. |
| 2017/0033210 | A1 | 2/2017 | Curatola et al. |
| 2017/0244407 | A1 | 8/2017 | Prechtl et al. |
| 2017/0250273 | A1 | 8/2017 | Schultz et al. |
| 2017/0365702 | A1 | 12/2017 | Prechtl et al. |
| 2017/0373176 | A1 | 12/2017 | Sriram |
| 2017/0373178 | A1 | 12/2017 | Sriram et al. |
| 2019/0237569 | A1 | 8/2019 | Sriram et al. |
| 2020/0219987 | A1 | 7/2020 | Lee et al. |
| 2020/0357907 | A1 | 10/2020 | Udrea et al. |
| 2021/0126120 | A1 | 4/2021 | Piedra et al. |

FOREIGN PATENT DOCUMENTS

| | | |
|---|---|---|
| CN | 103178108 A | 6/2013 |
| CN | 103329256 A | 9/2013 |
| CN | 105405877 A | 3/2016 |
| EP | 3276670 A1 | 1/2018 |
| JP | 2002-076024 A | 3/2002 |
| JP | 2006-507683 A | 3/2006 |
| JP | 2012-156320 A | 8/2012 |
| JP | 2012-231002 A | 11/2012 |
| JP | 2012-238751 A | 12/2012 |
| JP | 2013-106022 A | 5/2013 |
| JP | 2013-131755 A | 7/2013 |
| JP | 2014-504013 A | 2/2014 |
| JP | 2014-520405 A | 8/2014 |
| JP | 2017-059786 A | 3/2017 |
| JP | 2019-091757 A | 6/2019 |
| JP | 2019-519121 A | 7/2019 |
| WO | WO 2015/013620 A1 | 1/2015 |
| WO | WO 2017/223403 A1 | 12/2017 |

OTHER PUBLICATIONS

"Fabrication and Characterization of Heterojunction Diodes with HVPE-Grown GaN on 4H-SiC", Erik Danielsson, Carl-Mikael Zetterling, Mikael Ostling, Andrey Nikolaev, Irina P. Nikitina, and Vladimir Dmitriev. IEEE Transactions on Electron Devices, vol. 48, No. 3, Mar. 2001.

Shilaja P. Rao, "Implant Annealing of al dopants in silicon carbide using silane overpressure", 2005, p. 21-22, retrieved from http://scholarscommons.usf.edu/cgi/viewcontent.cgi?article=1828&context=etd on Aug. 28, 2017.

Wendt et al., FIB Milling and Canneling, Nov. 1, 2008, p. 1, Figure 1; Retrieved from http://www.imaging-git.com/science/scanning-probe-microscopy/fib-milling-and-canneling on Aug. 28, 2017.

International Search Report and Written Opinion dated Sep. 21, 2007 for PCT/US2017/38937, filed Jun. 23, 2017.

International Search Report and Written Opinion Issued in PCT/US2020/015331, dated Mar. 4, 2020.

R.R. Pela, et al., "Accurante Band Gaps of AlGaN, InGaN, and AllnN Alloys Calculations Based on LDA-1/2 Approach." Appl. Phys. Lett. 98, 151907 (2011).

International Preliminary Report on Patentability issued in PCT/US2020/015331, dated Mar. 10, 2021.

Final Office Action issued in U.S. Appl. No. 15/192,545, dated Apr. 12, 2018; 21 pages.

Kayali et al., "GaAs MMI C Reliability Assurance Guideline forSpace Applications" JPL Publication 96-25, Nat'l Aeronautics and Space Administration, Dec. 15, 1996, 221 pages.

Sun et al.; "Impact of Traps on the Adjacent Channel Power Ratios of GaN HEMTs"; IEEE Electron Device Letters; vol. 41 No. 6; Jun. 2020; p. 816-819.

International Patent Application No. PCT/US2022/18489; Int'l Search Report and the Written Opinion; dated May 23, 2022; 22 pages.

International Patent Application No. PCT/US2022/13085; Int'l Search Report and the Written Opinion; dated Jun. 28, 2022; 21 pages.

International Patent Application No. PCT/US2022/028963; Int'l Search Report and the Written Opinion; dated Sep. 1, 2022; 12 pages.

European Patent Application No. 20749178.8; Partial Search Report; dated Sep. 28, 2022; 10 pages.

Chiu et al.; "Analysis of the Back-Gate Effect in Normally Off p-GaN Gate High-Electron Mobility Transistor"; IEEE Transactions on Electron Devices; vol. 62 No. 2; Feb. 2015; p. 507-511.

(56) References Cited

OTHER PUBLICATIONS

European Patent Application No. 20749178.8; Extended Search Report; dated Feb. 2, 2023; 11 pages.

* cited by examiner

GALLIUM NITRIDE HIGH-ELECTRON MOBILITY TRANSISTORS WITH P-TYPE LAYERS AND PROCESS FOR MAKING THE SAME

CROSS-REFERENCE TO RELATED APPLICATIONS

This application is a continuation of U.S. patent application Ser. No. 15/192,545, filed Jun. 24, 2016 now U.S. Pat. No. 11430882 issued Aug. 30, 2022, which is incorporated herein by reference in its entirety.

FIELD OF THE DISCLOSURE

The disclosure relates to microelectronic devices and more particularly to gallium nitride high-electron mobility transistors with p-type layers. The disclosure also relates to a process of making microelectronic devices and more particularly to a process of making gallium nitride high-electron mobility transistors with p-type layers.

BACKGROUND OF THE DISCLOSURE

Electrical circuits requiring high power handling capability (>20 watts) while operating at high frequencies such as radio frequencies (500 MHz), S-band (3 GHz), X-band (10 GHz), and the like have in recent years become more prevalent. Because of an increase in power, there has been a corresponding increase in demand for transistors that are capable of reliably operating at radio frequencies and above while still being capable of handling higher power loads.

Gallium Nitride (GaN) based high-electron mobility transistors (HEMTs) are very promising candidates for high power radiofrequency (RF) applications because the material properties of GaN enable achievement of high voltage, high current, high RF gain, and good linearity. However, an important issue in these devices is the design of the buffer layer. Many designs currently use deep level impurities such as Iron (Fe) to minimize current flow through the buffer at high drain voltage conditions. Fe, however, leads to drain lag effect, which is a slow recovery of drain current when a drain voltage is changed from a high value to a lower one. This is very undesirable in some applications because it can lead to distortion, and also can complicate pre-distortion correction schemes. The drain lag effect may be eliminated by using high-purity buffer layers without Fe. However, these devices may have high leakage current through the buffer, which may also be undesirable. A similar issue has been observed with Silicon Carbide (SiC) metal-semiconductor field effect transistors (MESFETs), and the problem was solved by developing a new design with p-type layers in the source region. However, it is difficult to implement this solution in GaN HEMTs because it is not easy to form p-type layers in GaN by implantation.

Accordingly, there is a need for a simpler alternative solution to forming p-type layers in GaN HEMTs.

SUMMARY OF THE DISCLOSURE

According to an aspect of this disclosure, a high-electron mobility transistor includes a substrate layer, a first buffer layer provided on the substrate layer, a barrier layer provided on the first buffer layer, a source provided on the barrier layer, a drain provided on the barrier layer, a gate provided on the barrier layer, and a p-type material layer having a length parallel to a surface of the substrate layer over which the first buffer layer is provided, the length of the p-type material layer being less than an entire length of the substrate layer, wherein the p-type material layer is provided in one of the following: the substrate layer, or the first buffer layer.

According to another aspect of this disclosure, a process of making high-electron mobility transistor includes providing a substrate layer, providing a first buffer layer on the substrate layer, providing a barrier layer arranged on the first buffer layer, and providing a p-type material layer having a length parallel to a surface of the substrate layer over which the first buffer layer is provided, the length of the p-type material layer being less than an entire length of the substrate layer, wherein the p-type material layer is provided in one of the following: the substrate layer, or the first buffer layer.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure.

Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the electron mobility, saturated electron drift velocity, electric breakdown field and thermal conductivity may have an effect on a transistor's high frequency and high power characteristics.

Electron mobility is the measurement of how rapidly an electron is accelerated to its saturated velocity in the presence of an electric field. In the past, semiconductor materials which had a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has been known for many years to have excellent physical and electronic properties which should theoretically allow production of electronic devices that can operate at higher temperatures, higher power, and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-°K indicate that SiC would be suitable for high frequency, and high power applications.

This disclosure is directed to transistors and methods for making the transistors for high power RF applications. Typical GaN-based HEMTs are useful for such applications, but typical buffer layers have a drain lag effect—a slow recovery of drain current when the drain voltage is changed from a high value to a lower one. Distortion and other problems can result from this effect, so p-type layers may be used in select regions. Aspects of this disclosure include variations of transistors with p-type layers and the ways those p-type layers are formed. The disclosed aspects can maximize RF power, allow for efficient discharge, and can help minimize breakdowns.

Figure 1:
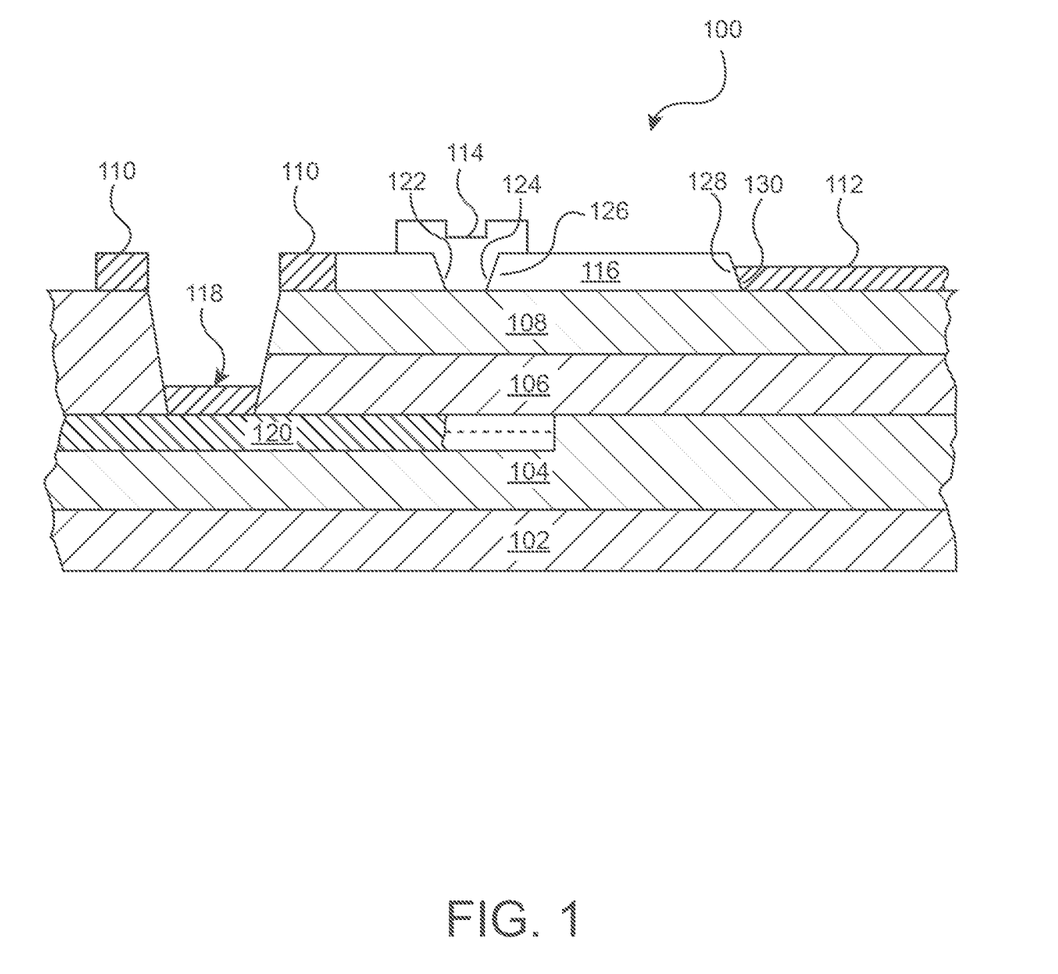
FIG. 1 shows a cross-sectional view of a transistor according to the principles of the disclosure.

FIG. 1 shows a cross-sectional view of a transistor 100. The transistor 100 may include a substrate layer 102. The substrate layer 102 may be made of Silicon Carbide (SiC). In some aspects, the substrate layer 102 may be a semi-insulating SiC substrate, a p-type substrate, an n-type substrate and/or the like. In some aspects, the substrate layer 102 may be very lightly doped. In another aspect, the substrate layer 102 may be gallium arsenide (GaAs), GaN, or other material suitable for the applications described herein. The substrate layer 102 may be of either p-type or n-type conductivity or semi-insulating. The substrate layer 102 of either p-type or n-type may be very lightly doped. The substrate layer 102 may be formed of SiC selected from the group of 6H, 4H, 15R 3C SiC, or the like.

On the substrate layer 102, a first buffer layer 104, or nucleation layer, may be formed. In one aspect, the first buffer layer 104 is formed directly on the substrate layer 102. The first buffer layer 104 may be GaN, Aluminum Gallium Nitride (AlGaN), Aluminum Nitride (AlN), or another suitable material and may also include a nucleation layer of AlN. In one aspect, the first buffer layer 104 is formed of GaN. The first buffer layer 104 may be a p-type material, or alternatively can be undoped. An AlN nucleation layer may be used to adhere to the substrate layer 102 and may help grow the first buffer layer 104. The first buffer layer 104 may bind to the substrate layer 102.

According to one aspect, the substrate layer 102 may include silicon carbide, sapphire, spinel, ZnO, silicon or any other material capable of supporting growth of Group III-nitride materials. An $Al_zGa_{1-z}N$ ($0<=z<=1$) nucleation layer or first buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of nucleation layer may depend on the material of the substrate layer 102.

A second buffer layer 106 may be deposited or grown on the first buffer layer 104 on a side of the first buffer layer 104 opposite of the substrate layer 102. In one aspect, the second buffer layer 106 is formed directly on the first buffer layer 104. The second buffer layer 106 may be a high-purity material such as Gallium Nitride (GaN), AlN, or the like. In one aspect, the second buffer layer 106 may be a high-purity GaN. In one aspect, the second buffer layer 106 may be a high-purity AlN. The second buffer layer 106 may be a p-type material or n-type material. In another aspect, the second buffer layer 106 may be undoped.

In another aspect, the first buffer layer 104 and/or the second buffer layer 106 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

On the second buffer layer 106 on a side opposite of the first buffer layer 104, a barrier layer 108 may be formed. In one aspect, the barrier layer 108 may be formed directly on the second buffer layer 106. The barrier layer 108 may provide an additional layer between the second buffer layer 106 and a source 110, a drain 112, and a gate 114. The barrier layer 108 may be AlGaN, AlN, or another suitable material. In one aspect, the barrier layer 108 is AlGaN. In one aspect, the barrier layer 108 may be undoped. In one aspect the barrier layer 108 may be an n-type material. Alternatively, the barrier layer 108 may have multiple layers of n-type material having different carrier concentrations.

To protect and separate the gate 114 and the drain 112, a protective layer 116 may be arranged on the barrier layer 108, on a side opposite the second buffer layer 106, between the gate 114 and drain 112. The protective layer 116 may be a passivation layer made of SiN, AlO, SiO, $SiO_2$ or the like. In one aspect, the protective layer 116 is a passivation layer made of SiN.

The source 110 may have a p-type material contact 118 on a p-type material layer 120. The p-type material contact 118 may be formed on the p-type material layer 120 in a recess provided in the second buffer layer 106 and the barrier layer 108. The p-type material contact 118 may be electrically coupled to the p-type material layer 120. The recess may extend down to the p-type material layer 120 to allow for the p-type material contact 118 to be created there. The recess may be formed by etching, and may also use a material to define the recess. The material may be removed after the recess has been created.

The p-type material layer 120 may include Mg, Mg implanted GaN, AlGaN, or another suitable material. In one aspect, the p-type material layer may be formed in the first buffer layer 104 or alternatively on the first buffer layer 104. In an aspect, the p-type material layer 120 may be formed by Mg implantation and subsequently annealed. Other materials are contemplated as well. Implantation of the Mg p-type material layer 120 may expand the entire length of the substrate layer 102 or may be neutralized to limit the length of the p-type material layer 120. In one aspect, neutralizing may include implantation of O, N, or other impurities. In one aspect, neutralizing the p-type material layer 120 may include absorbing the charge of the p-type material layer 120 with a material of opposite polarity. Another way to limit the length of the p-type material layer 120 may be to etch the p-type material layer 120. Another way to limit the length of the p-type material layer 120 may be to use a masking material to limit the area for implantation.

In another aspect, the Mg p-type material layer 120 may be formed by doping the first buffer layer 104. The doped first buffer layer 104 may grow to form the p-type material layer 120. Growth may be epitaxial, for example. To limit the length of the p-type material layer 120, the p-type material layer 120 may be etched or otherwise neutralized.

The p-type material layer 120 may help avoid breakdowns and problems with material impurities. For example, without a p-type material layer 120, the transistor 100 may need impurities which do not discharge well. The p-type material layer 120 may be formed beneath the source 110, and may extend toward the drain 112 of the device. In one aspect, the p-type material layer 120 may provide a retarding electric field to obtain strong electron confinement with low leakage.

In one aspect of the present disclosure, the p-type material layer 120 may not extend over the entire area of the substrate layer 102 as shown by the dashed line. In one aspect, the p-type material layer 120 may not extend over the entire length of the substrate layer 102. In this regard, the p-type material layer 120 may be selectively arranged as described in detail below, the p-type material layer 120 may be arranged over the entire length and selectively removed as described in detail below, the p-type material layer 120 may be arranged over the entire length and selectively electrically neutralized as described in detail below, or the like. Alternatively, the p-type material layer 120 may extend the entire length and remain. Accordingly, the specific constructions of the p-type material layer 120 described below encompass any of these processes that result in the p-type material layer 120 having an operating construction and arrangement as noted below. In other words, the length and/or size of the p-type material layer 120 does not include a part that is partially electrically neutralized or partially etched. The length and/or size of the p-type material layer 120 may depend on the application of the transistor 100, requirements for the transistor 100, and the like.

In one aspect of the present disclosure, the p-type material layer 120 may extend laterally from at least beneath the p-type material contact 118 to a position beneath a proximal edge 122 of the gate 114.

In one aspect of the present disclosure, the p-type material layer 120 may extend laterally from at least beneath the p-type material contact 118 to a position beneath and between a proximal edge 122 of the gate 114 and a distal edge 124 of the gate 114.

In certain aspects of the present disclosure, the p-type material layer 120 may extend to a point within about 0 to about 0.3 μm of the proximal edge 122 of the gate 114.

In one aspect of the present disclosure, the p-type material layer 120 may extend laterally from at least beneath the p-type material contact 118 to a position beneath a distal edge 124 of the gate 114.

In one aspect of the present disclosure, the p-type material layer 120 may extend laterally from at least beneath the p-type material contact 118 to a position beneath a proximal edge 126 of the protective layer 116.

In one aspect of the present disclosure, the p-type material layer 120 may extend laterally from at least beneath the p-type material contact 118 to a position beneath and between a proximal edge 126 of the protective layer 116 and a distal edge 128 of the protective layer 116.

In one aspect of the present disclosure, the p-type material layer 120 may extend laterally from at least beneath the p-type material contact 118 to a position beneath a distal edge 128 of the protective layer 116.

In one aspect of the present disclosure, the p-type material layer 120 may extend laterally from at least beneath the p-type material contact 118 to a position beneath a proximal edge 130 of the drain 112.

In one aspect of the present disclosure, the p-type material layer 120 may extend laterally from at least beneath the p-type material contact 118 to a position beyond the proximal edge 130 of the drain 112.

The p-type material layer 120 may extend within the first buffer layer 104 with Mg doping or within the substrate layer 102 with Al doping. A presence of the p-type material beneath the source 110 may inhibit electron injection from the source 110, thereby improving breakdown voltage. Limiting the p-type material layer 120 so that it does not extend beneath the drain 112 avoids adverse effects on RF performance for certain transistor applications.

A gate contact may be provided for the gate 114 in between the source 110 and the drain 112. In one aspect, the gate contact may be provided in a recess between the source 110 and the drain 112. Furthermore, in certain aspects of the present disclosure, the gate contact may be disposed on the barrier layer 108.

The gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three layer structure. Such a structure may have advantages because of the high adhesion of some materials. The gate 114 may further include an overlayer of highly conductive metal.

In another aspect, metal overlayers may be provided on one or more of the source 110 and p-type material contact 118, the drain 112 and the gate 114. The overlayers may be Au, Silver (Ag), Al, Pt and/or Copper (Cu). Other suitable highly conductive metals may also be used for the overlayer. Furthermore, the metal overlayer may electrically couple the p-type material contact 118.

Figure 2:
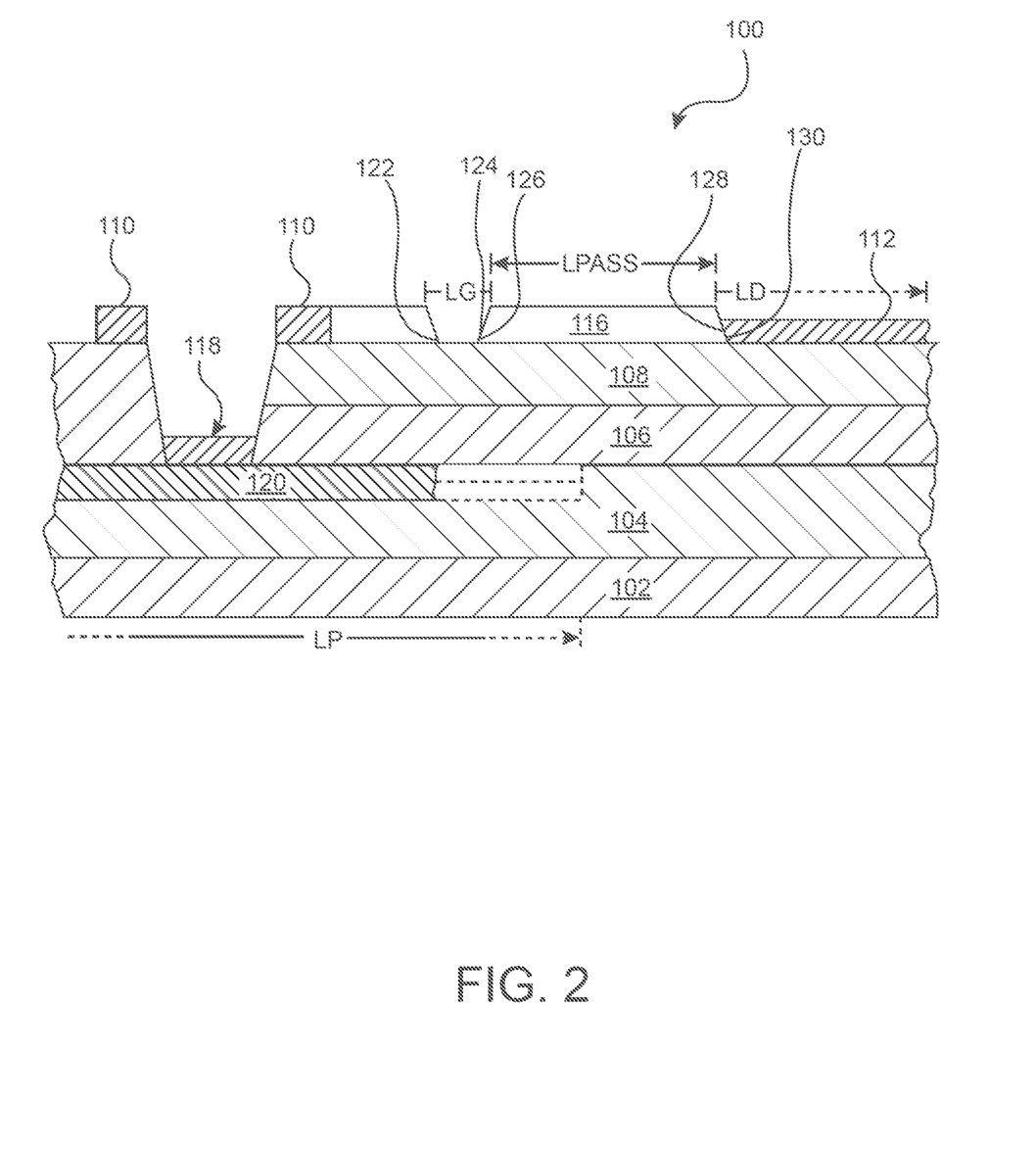
FIG. 2 shows another cross-sectional view of the transistor of FIG. 1 according to the principles of the disclosure.

FIG. 2 shows another cross-sectional view of the transistor 100 of FIG. 1. In this cross-sectional view, a length LP of the p-type material layer 120 can be seen in relation to positions and/or lengths of other components. The length LG of the gate 114 may be the length between a proximal edge 122 and a distal edge 124. The width of the gate 114 is defined as the dimension of the gate perpendicular to the flow of current. The length LG of the gate 114 is the dimension of the gate parallel to the flow of current. For example, the gate length LG of the HEMT according to certain aspects of the disclosure may be from about 0.4 μm to about 0.7 μm. Other dimensions may include a length LPASS of the protective layer 116 and a length LD of the drain 112 parallel to the flow of current as well.

Another dimension is the source 110 to gate 114 distance. The source 110 to gate 114 distance according to certain aspects of the disclosure may be from about 0.5 μm to about 0.7 μm. Furthermore, the distance from the drain 112 to the gate 114 may be from about 1.5 pm to about 2 pm. Aspects of the disclosure may further include a plurality of unit cells, and the distance from a first gate of the unit cells to a second gate may be, for example, from about 20 μm to about 50 μm.

If the p-type material layer 120 is present in a region corresponding to the gate 114 and the drain 112, RF performance of the transistor 100 can be adversely impacted. Therefore, it may be desirable to form the p-type material layer 120 from under the source 110 extending a length LP, which can be defined in relation to one or more of the length LG of the gate 114, the length LPASS of the protective layer 116, and the length LD of the drain 112. For the following aspects, the length LG will represent the length LG of the gate 114 starting from a side most proximal to the source 110, the length LPASS will represent the length LPASS of the protective layer 116 starting from a side most proximal to the source 110, and the length LD will represent the length LD of the drain 112 starting from a side most proximal to the source 110.

In one aspect, the length LP of the p-type material layer 120 may extend to 0% of LG, meaning the p-type material layer 120 may extend only to the proximal edge 122 of the gate 114, where LG equals zero.

In one aspect, the length LP of the p-type material layer 120 may extend from 0% to 20% of LG, meaning the p-type material layer 120 may extend 0% to 20% past the proximal edge 122 of the gate 114.

In one aspect, the length LP of the p-type material layer 120 may extend from 20% to 40% of LG, meaning the p-type material layer 120 may extend 20% to 40% past the proximal edge 122 of the gate 114.

In one aspect, the length LP of the p-type material layer 120 may extend from 40% to 60% of LG, meaning the p-type material layer 120 may extend 40% to 60% past the proximal edge 122 of the gate 114.

In one aspect, the length LP of the p-type material layer 120 may extend from 60% to 80% of LG, meaning the p-type material layer 120 may extend 60% to 80% past the proximal edge 122 of the gate 114.

In one aspect, the length LP of the p-type material layer 120 may extend from 80% to 100% of LG, meaning the p-type material layer 120 may extend 80% to 100% past the proximal edge 122 of the gate 114.

In one aspect, the length LP of the p-type material layer 120 may extend from 0% to 50% of LG, meaning the p-type material layer 120 may extend 0% to 50% past the proximal edge 122 of the gate 114.

In one aspect, the length LP of the p-type material layer 120 may extend from 50% to 100% of LG, meaning the p-type material layer 120 may extend 50% to 100% past the proximal edge 122 of the gate 114.

In one aspect, the length LP of the p-type material layer 120 may extend to 0% of LPASS, meaning the p-type material layer 120 may extend only to the proximal edge 126 of the protective layer 116, where LPASS equals zero.

In one aspect, the length LP of the p-type material layer 120 may extend from 0% to 20% of LPASS, meaning the p-type material layer 120 may extend 0% to 20% past the proximal edge 126 of the protective layer 116.

In one aspect, the length LP of the p-type material layer 120 may extend from 20% to 40% of LPASS, meaning the p-type material layer 120 may extend 20% to 40% past the proximal edge 126 of the protective layer 116.

In one aspect, the length LP of the p-type material layer 120 may extend from 40% to 60% of LPASS, meaning the p-type material layer 120 may extend 40% to 60% past the proximal edge 122 of the gate 114.

In one aspect, the length LP of the p-type material layer 120 may extend from 60% to 80% of LPASS, meaning the p-type material layer 120 may extend 60% to 80% past the proximal edge 126 of the protective layer 116.

In one aspect, the length LP of the p-type material layer 120 may extend from 80% to 100% of LPASS, meaning the p-type material layer 120 may extend 80% to 100% past the proximal edge 126 of the protective layer 116.

In one aspect, the length LP of the p-type material layer 120 may extend from 0% to 50% of LPASS, meaning the p-type material layer 120 may extend 0% to 50% past the proximal edge 126 of the protective layer 116.

In one aspect, the length LP of the p-type material layer 120 may extend from 50% to 100% of LPASS, meaning the p-type material layer 120 may extend 50% to 100% past the proximal edge 126 of the protective layer 116.

In one aspect, the length LP of the p-type material layer 120 may extend to 0% of LD, meaning the p-type material layer 120 may extend only to the proximal edge 130 of the drain 112, where LD equals zero.

In one aspect, the length LP of the p-type material layer 120 may extend from 0% to 20% of LD, meaning the p-type material layer 120 may extend 0% to 20% past the proximal edge 130 of the drain 112.

In one aspect, the length LP of the p-type material layer 120 may extend from 20% to 40% of LD, meaning the p-type material layer 120 may extend 20% to 40% past the proximal edge 130 of the drain 112.

In one aspect, the length LP of the p-type material layer 120 may extend from 40% to 60% of LD, meaning the p-type material layer 120 may extend 40% to 60% past the proximal edge 130 of the drain 112.

In one aspect, the length LP of the p-type material layer 120 may extend from 0% to 40% of LD, meaning the p-type material layer 120 may extend 0% to 40% past the proximal edge 130 of the drain 112.

Figure 3:
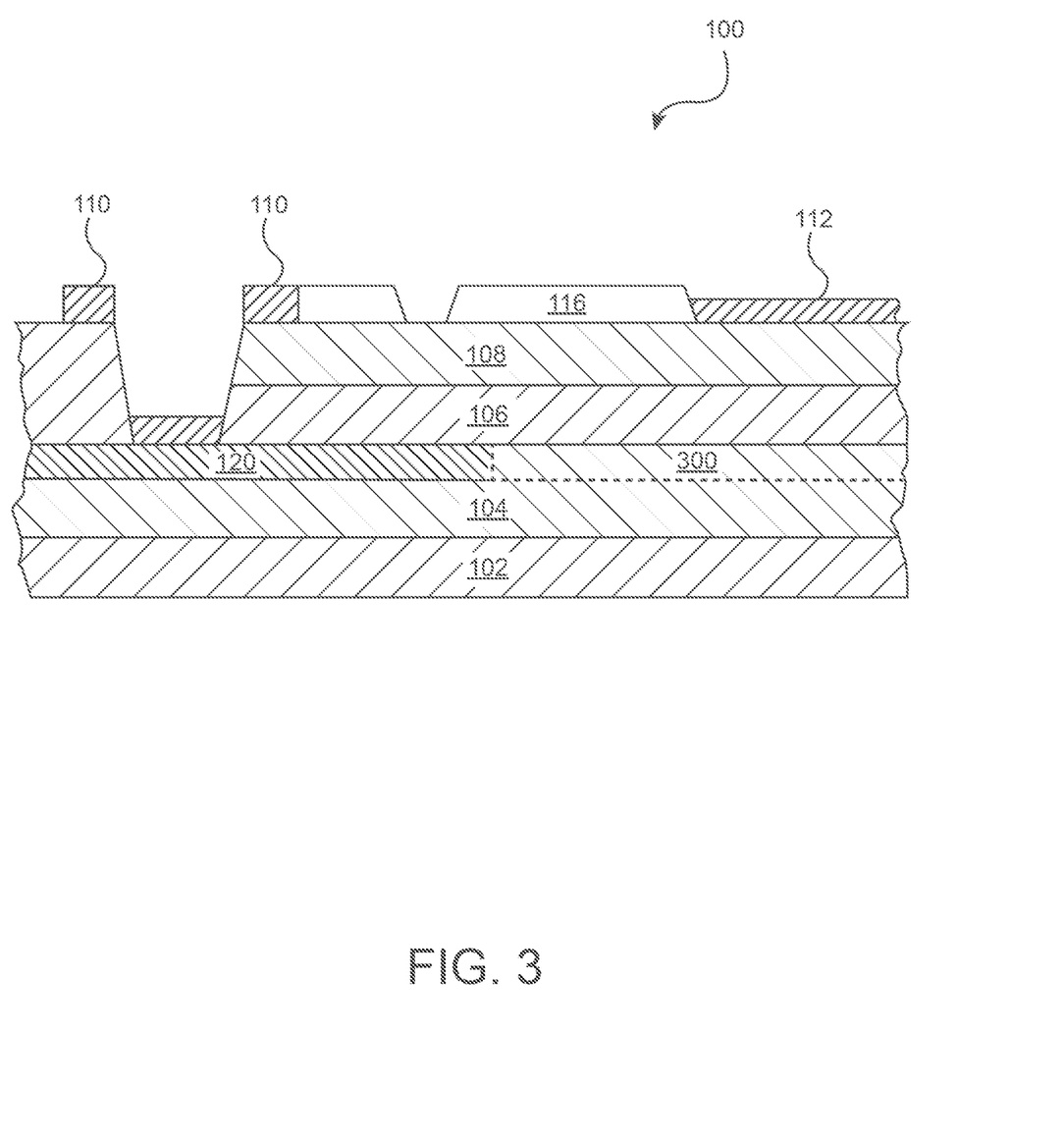
FIG. 3 shows another cross-sectional view of the transistor of FIG. 1 according to the principles of the disclosure.

The p-type material layer 120 may be formed and modified in a variety of ways. FIG. 3 shows another cross-sectional view of the transistor 100 of FIG. 1. In FIG. 3, the p-type material layer 120 may be formed between the first buffer layer 104 and the second buffer layer 106 so that it extends across the entire length of the substrate layer 102 including area 300. This may allow for a sequential layering. To limit the p-type material layer 120 to a region outside of the gate 114 and drain 112 as described above, the p-type material layer 120 may be etched in the area 300 from the substrate layer 102 or the first buffer layer 104. Etching may include dry etching, such as Electron Cyclotron Resonance etching, Inductively Coupled Plasma etching, or the like.

In another aspect, the p-type material layer 120 may be formed via implantation and annealing. The p-type material layer 120 may be implanted within the first buffer layer 104 and/or the second buffer layer 106. In one aspect, the p-type material layer 120 may be implanted in the first buffer layer 104. In this regard, the implantation of the p-type material layer 120 may be in the first buffer layer 104 except in the area 300, or may be etched or otherwise removed from the area 300. Annealing may allow for the implantation. In one aspect, a masking layer material may be utilized during implantation. GaN may dissociate during annealing, so when the p-type material layer 120 is annealed, a masking layer material may be used to cover regions in which the p-type material layer 120 should be formed. Once the p-type material layer 120 has been formed, the masking layer material may be removed. Annealing may be performed at a temperature range of 1200-1400° C., for example.

In another aspect, "islands" may be used to limit the growth of the p-type material layer 120. Islands may be formed with materials on which the p-type material layer 120 may not grow. Therefore, the p-type material layer 120 may be grown or implanted in between the islands to create the p-type material layer 120 and keep it out of a region associated with the gate 114 and drain 112. For example, the islands can represent the ends of length LP in FIG. 3 so that placing the p-type material layer 120 between the islands results in a length of LP. In this regard, the islands may be formed on the first buffer layer 104 in the area 300. In one aspect, the p-type material layer may be formed with epitaxy.

Figure 4:
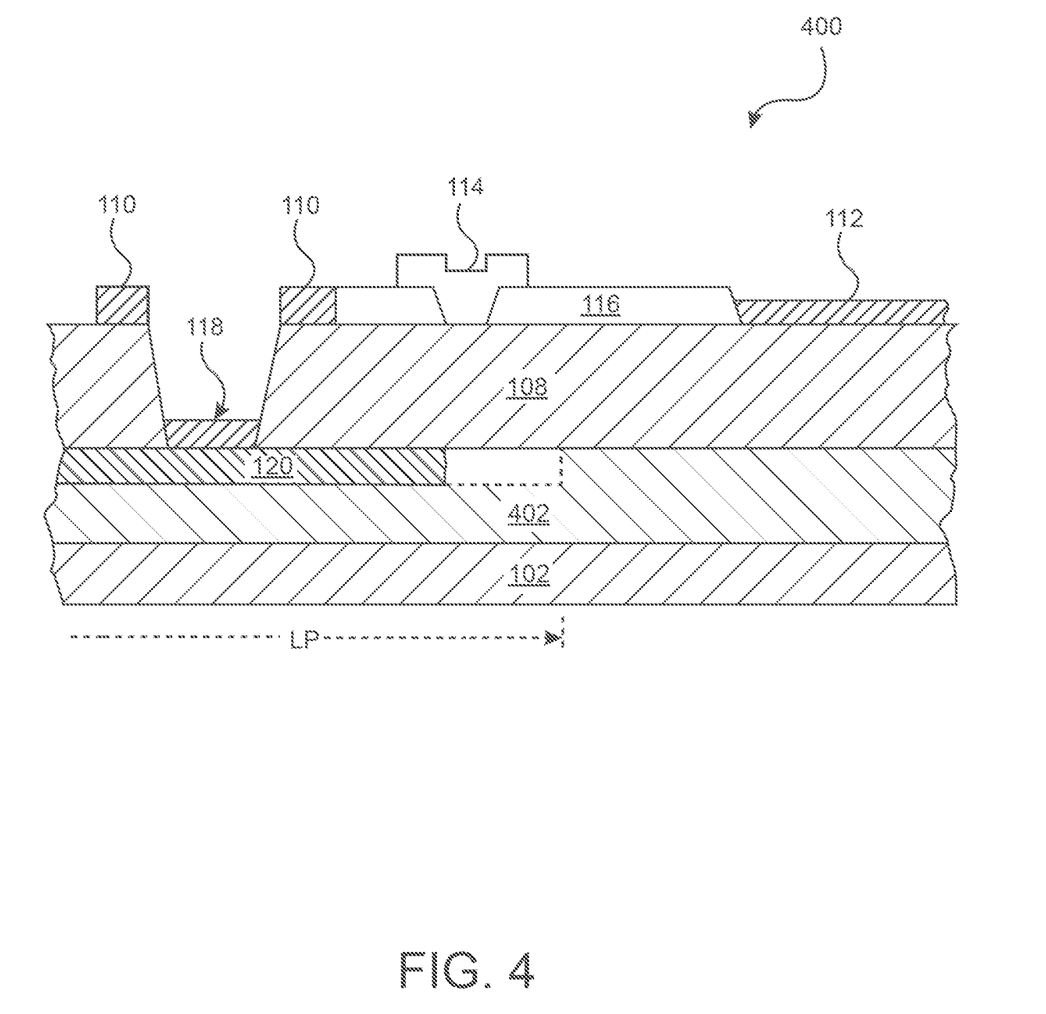
FIG. 4 shows a cross-sectional view of another aspect of a transistor according to principles of the disclosure.

FIG. 4 shows a cross-sectional view of another transistor 400. The transistor 400 may have the substrate layer 102, the barrier layer 108, the source 110, the drain 112, the gate 114, the protective layer 116, the p-type material contact 118, the p-type material layer 120, and the like that may be consistent with the previously described aspects. The difference between transistor 400 and transistor 100 of FIG. 1 may be the use of a single buffer layer 402 instead of the first buffer layer 104 and the second buffer layer 106. The buffer layer 402 may be GaN or the like, and the substrate layer 102 may be SiC or the like. In one aspect, the buffer layer 402 may be high purity to minimize drain lag effects. In one aspect, the buffer layer 402 may be consistent with the first buffer layer 104. In one aspect, the p-type material layer 120 may be formed in the buffer layer 402 consistent with previous aspects. In one aspect, the p-type material layer 120 may be formed within the substrate layer 102 (see FIG. 5).

Similar to transistor 100, the p-type material layer 120 may be formed in the buffer layer 402 in a way that prevents it from being within a region associated with the gate 114 and drain 112. To form the p-type material layer 120, the p-type material layer 120 may be implanted and annealed. In an aspect, the p-type material layer 120 may be etched to limit its length relative to a position of the gate 114. Alternatively, the p-type material layer 120 may be formed in between islands of high-purity material on which the p-type material layer 120 may not grow so that the p-type material layer 120 is limited to a length in between the islands. Additionally, the p-type material layer 120 may have a length and/or size consistent to the various length and/or size aspects described above. After the p-type material layer 120 has been formed, the barrier layer 108 may be grown. In one aspect, it may be beneficial for there to be a space in the vertical direction between the p-type material layer 120 and the barrier layer 108. In transistor 400, the placement of the p-type material layer 120 may be limited as described above. However, the placement of the p-type material layer 120 may be different from the placement of the p-type material layer 120 in transistor 100 shown in FIG. 1.

Figure 5:
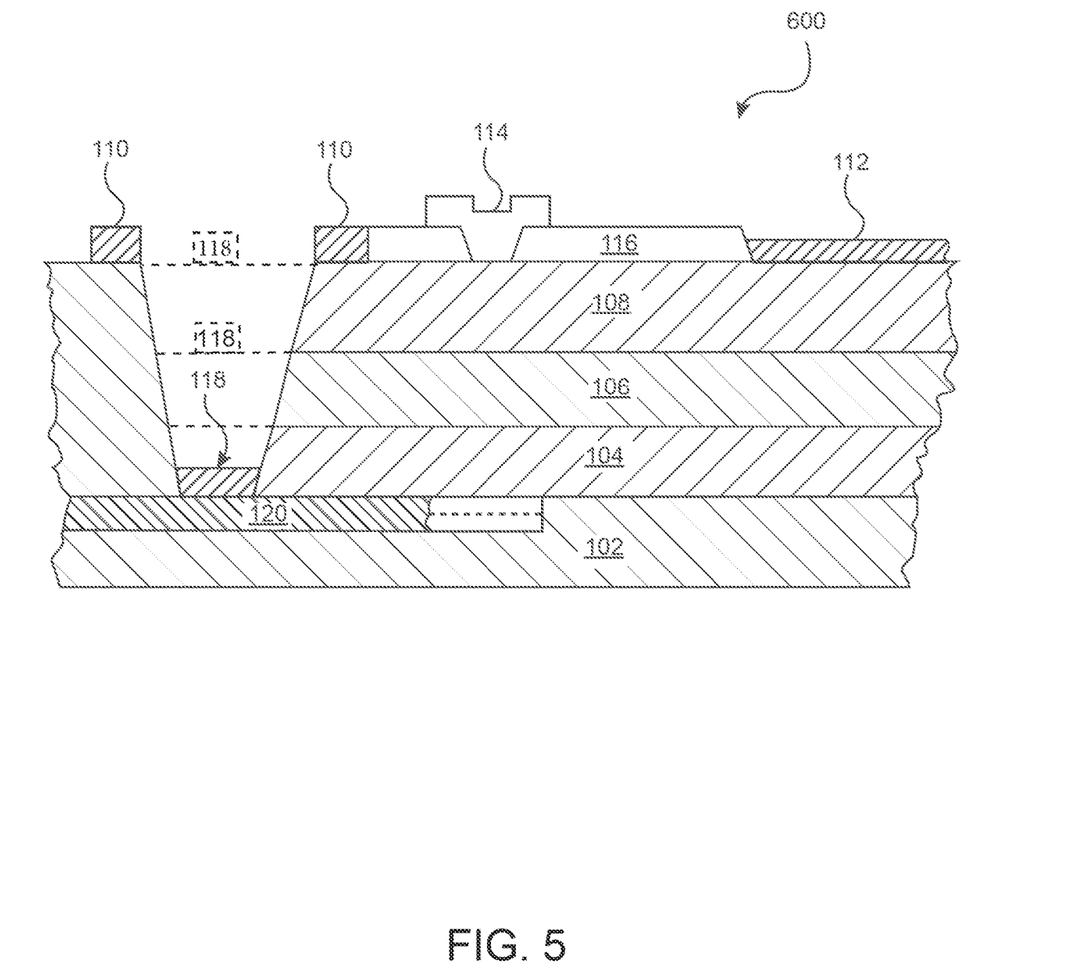
FIG. 5 shows a cross-sectional view of another aspect of a transistor according to principles of the disclosure.

FIG. 5 shows a cross-sectional view of another transistor 600. In transistor 600, the p-type material layer 120 may be formed in or on the substrate layer 102. While FIG. 5 illustrates the transistor 600 with the first buffer layer 104 and the second buffer layer 106, the transistor 600 may also use only one buffer layer 104 (402 as shown in FIG. 4). In one aspect, to form the p-type material layer 120 in the substrate layer 102, Al may be implanted in the substrate layer 102 and annealed. In one aspect, the substrate layer 102 may be doped with the p-type material layer 120. In one aspect, the substrate layer 102 may be boron doped to form the p-type material layer 120. Other materials are contemplated as well including Ga. The length of the p-type material layer 120 near the surface of the p-type material layer 120 can be limited using the techniques described in other aspects above. Subsequently, the buffer layer(s) may be formed by growing AlN and GaN layers.

In another aspect, the p-type material layer 120 may be formed by ion implantation of, for example, Al, Boron (B) and/or Gallium (Ga), followed by a high temperature anneal. Suitable anneal temperatures may be from about 1300 to about 1600° C., typically about 1500° C. The ions may be implanted within portions of the substrate layer 102 to provide a highly doped region of p-type conductivity, for example, p-type conductivity SiC. Once implanted, the dopants are annealed to activate the implant. The highly doped region of p-type conductivity may extend about 0.4 μm into the substrate layer 102.

In another aspect, rather than etching through each layer until reaching the p-type material layer 120, the p-type material layer 120 can be implanted to create a column of the p-type material layer 120. The column of the p-type material layer 120 may extend through all layers above the substrate layer 102, or through any combination of layers above the substrate layer 102 as shown by the dashed lines. In one aspect, a column may be limited to the source contact area so as to not extend toward the drain 112. As such, the column may be distinct from the p-type material layer 120. Additionally, the column may be used in the aspects associated with FIGS. 1-4.

Figure 6:
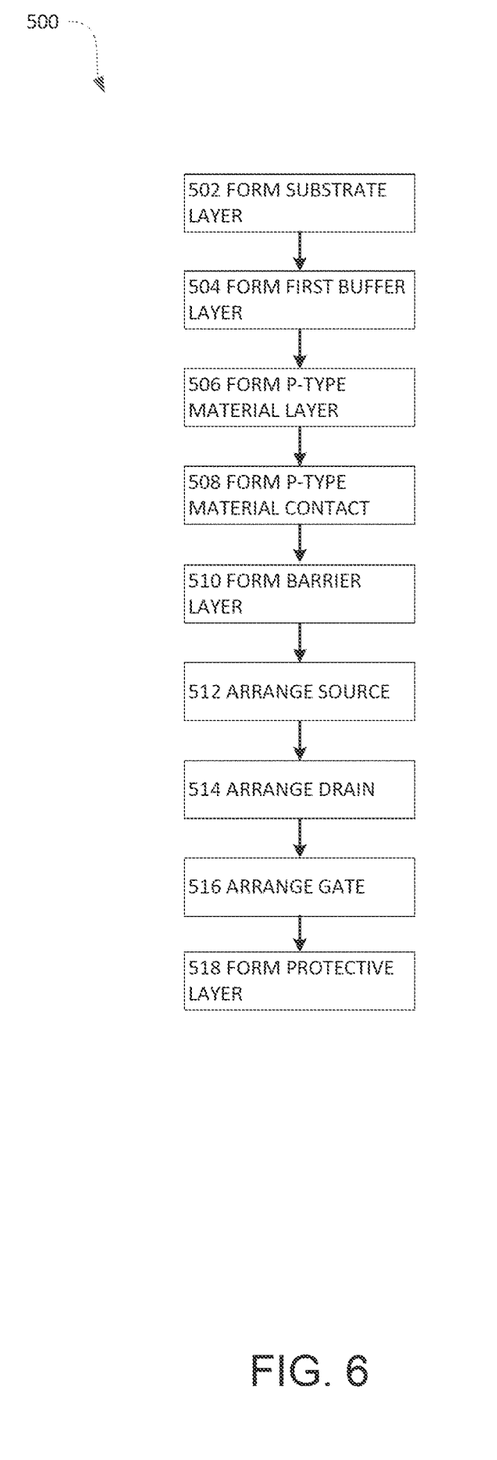
FIG. 6 shows a process for making a transistor according to the principles of the disclosure.

FIG. 6 shows a process 500 for making the transistor 100 of FIG. 1, the transistor 400 of FIG. 4, and/or the transistor 600 of FIG. 5. The process 500 may begin at step 502 by forming a substrate layer 102. The substrate layer 102 may be SiC of p-type or n-type, and may be doped. The substrate layer 102 may be semi-insulating.

In a first aspect directed to the transistor 100 of FIG. 1, the first buffer layer 104 may be formed at step 504 on the substrate layer 102. The first buffer layer 104 may be grown or deposited on the substrate layer 102. In one aspect, the first buffer layer 104 may be GaN. In another aspect, the first buffer layer 104 may be formed with LEO. At step 506, the p-type material layer 120 may be formed in or on the first buffer layer 104 as shown in FIGS. 1-3. The p-type material layer 120 may be formed in a variety of ways. One way is to implant and anneal the p-type material layer 120. To implant and anneal the p-type material layer 120, a masking material may be formed for implanting the p-type material layer 120. The p-type material layer 120 may be formed in the buffer layer 104 by ion implantation of Mg followed by a high temperature anneal. Other materials are contemplated as well. Suitable anneal temperatures may be from about 1200 to about 1500° C., typically about 1300° C. The ion implantation may be performed on the regions that are not covered by the masking material to form the p-type material layer 120. Thus, the ions may be implanted in portions of the first buffer layer 104 to provide a highly doped region of p-type conductivity. Once implanted, the dopants may be annealed to activate the implant. The highly doped region of p-type conductivity may extend about 0.4 μm into the first buffer layer 104.

In a second aspect directed to the transistor 400 of FIG. 4, the first buffer layer 402 may be formed at step 504 on the substrate layer 102. The first buffer layer 402 may be grown or deposited on the substrate layer 102. In one aspect, the first buffer layer 402 may be GaN. In another aspect, the first buffer layer 402 may be formed with LEO. At step 506, the p-type material layer 120 may be formed in or on the first buffer layer 402. The p-type material layer 120 may be formed in a variety of ways. One way is to implant and anneal the p-type material layer 120. To implant and anneal the p-type material layer 120, a masking material may be formed for implanting the p-type material layer 120. The p-type material layer 120 may be formed in the buffer layer 402 by ion implantation of, for example, Mg, followed by a high temperature anneal. Suitable anneal temperatures may be from about 1200 to about 1500° C., typically about 1300° C. The ion implantation may be performed on the regions that are not covered by the masking material to form the p-type material layer 120. Thus, the ions may be implanted in portions of the first buffer layer 402. Once implanted, the dopants may be annealed to activate the implant. The highly doped region of p-type conductivity may extend about 0.4 μm into the first buffer layer 104, 402 and/or the substrate layer 102.

In a third aspect directed to the transistor 600 of FIG. 5, the process 500 may include implanting Al into the substrate layer 102 and thereafter annealing to form 506 the p-type material layer 120 in the substrate layer 102 as shown in FIG. 5. In an aspect in which the p-type material layer 120 is implanted into the substrate layer 102, suitable anneal temperatures may be from about 1440 to 1700° C., typically about 1600° C. Thereafter, an AlN nucleation layer may be grown. At step 504, the first buffer layer 104 may be formed. The first buffer layer 104 may be grown or deposited on the substrate layer 102. In one aspect, the first buffer layer 104 may be GaN. In another aspect, the first buffer layer 104 may be formed with LEO.

In one aspect, to avoid having the p-type material layer 120 in a region under the drain 112, the p-type material layer 120 may be etched. In another aspect, the p-type material layer 120 may be formed between islands of material on which the p-type material layer 120 cannot grow. In another aspect, to avoid having the p-type material layer 120 in a region under the drain 112, the p-type material layer 120 may be electrically neutralized. In one aspect, electrically neutralizing may include implantation of O, N, or other impurities.

After the p-type material layer 120 has been formed, the p-type material contact 118 may be formed at step 508. In one aspect, step 508 may be performed after the step 510 described below. Once the p-type material layer 120 is exposed, nickel or another suitable material may be evaporated to deposit the p-type material contact 118. The nickel or another suitable material may be annealed to form an ohmic contact, for example. Such a deposition and annealing process may be carried out utilizing conventional techniques known to those of skill in the art. For example, an ohmic contact for the p-type material contact 118 may be annealed at a temperature of from about 600° C. to about 1050° C. Once the p-type material contact 118 has been formed on the p-type material layer 120, a metal overlayer may electrically couple the p-type material contact 118 of the p-type material layer 120 to the source 110. Doing this may maintain the conductivity of the p-type material layer 120 and the source 110 at the same potential.

At step 510, the barrier layer 108 may be formed on the second buffer layer 106, the buffer layer 402, the first buffer layer 104, and/or the p-type material layer 120. The barrier layer 108 may be an n-type conductivity layer or may be undoped. In one aspect, the barrier layer 108 may be AlGaN.

At step 512, the source 110 may be arranged on the barrier layer 108. The source 110 may be an ohmic contact of a suitable material that may be annealed. For example, the source 110 may be annealed at a temperature of from about 950° C. to about 1100° C. for about 2 minutes. However, other times and temperatures may also be utilized. Times from about 30 seconds to about 10 minutes may be, for example, acceptable.

At step 514, the drain 112 may be arranged on the barrier layer 108. Like the source 110, the drain 112 may be an ohmic contact of Ni or another suitable material, and may also be annealed in a similar fashion. In one aspect, steps 512 and 514 may be performed in the same step.

At step 516, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials.

At step 518, the protective layer 116 may be formed. The protective layer 116 may be a passivation layer, such as SiN, AlO, SiO, $SiO_2$, or the like, which may be grown or deposited over the exposed surface of the barrier layer 108.

At step 518, the protective layer 116 may be formed. The protective layer 116 may be a passivation layer, such as SiN, AlO, SiO, $SiO_2$, or the like, which may be deposited over the exposed surface of the barrier layer 108. In another aspect of the disclosure, to create a place for contact with the p-type material layer 120, a recess may be created by removing the barrier layer 108, the second buffer layer 106, and at least part of the first buffer layer 104, 402. The recess may remove any material above the p-type material layer 120 within a portion of a region associated with the source 110, exposing the p-type material layer 120 on a side opposite of the substrate layer 102.

In one aspect, a high resistivity Group III-nitride buffer layer 104, 402 may be formed on the nucleation layer. Buffer layer 104, 402 may include $Al_xGa_yIn_{(1-x-y)}N$ ($0<=x<=1$, $0<=y<=1$, $x+y<=1$). Next, an $Al_xGa_{1-x}N$ ($0<=x<=1$) barrier layer 108 may be formed on the buffer layer 104, 402. Each of the buffer layer 104, 402 and barrier layer 108 may include sub-layers that may include doped or undoped layers of Group III-nitride materials.

In one aspect, a Group III-nitride semiconductor spacer layer may be grown on the $Al_xGa_{1-x}N$ barrier layer 108. The spacer layer may have a uniform or graded composition. The spacer layer may be undoped and/or may be designed to be fully depleted as grown.

Source 110 and drain 112 electrodes may be formed making ohmic contacts through the barrier layer 108 such that an electric current flows between the source and drain electrodes 110, 112 via a two-dimensional electron gas (2DEG) induced at the heterointerface between the buffer layer 104, 402 and barrier layer 108 when a gate electrode 114 is biased at an appropriate level.

The spacer layer may be etched and the gate electrode 114 deposited such that the bottom of the gate electrode 114 is on the surface of barrier layer 108. The metal forming the gate electrode 114 may be patterned to extend across spacer layer so that the top of the gate 114 forms a field plate structure extending a distance away from the edge of gate 114 towards drain 112. Stated differently, the part of the gate 114 metal resting on the spacer layer forms an epitaxial field plate. Finally, the structure is covered with a dielectric passivation layer 116 such as silicon nitride.

It should be noted that the steps of process 500 may be performed in a different order consistent with the aspects described above. The order in which features are arranged on the barrier layer 108, for example, may be different. Alternatively, when the p-type material contact 118 is deposited on the p-type material layer 120 relative to when other features are formed and arranged may differ. In addition, the order of forming different layers may depend on whether the p-type material layer 120 is formed in/on the substrate layer 102 before the first buffer layer 104, 402 is formed, or whether the p-type material layer 120 is formed in/on the first buffer layer 104, 402.

In an alternative aspect of the process 500, a second buffer layer 106 may be formed. The first buffer layer 104 may be disposed between the substrate layer 102 and a second buffer layer 106. In one aspect, the second buffer layer 106 may be GaN. Accordingly, the disclosure has set forth a simpler alternative solution to forming p-type layers in GaN HEMTs. The disclosed structure can be readily fabricated with currently available techniques. Moreover, the disclosed use of a high-purity material minimizes drain lag effects. Additionally, the disclosed p-type material layer provides a retarding electric field to obtain good electron confinement with low leakage. Additionally, aspects of this disclosure have described in detail variations of transistors with p-type layers and the ways those p-type layers are formed. The disclosed transistors maximize RF power, allow for efficient discharge, and minimize breakdowns.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A high-electron mobility transistor comprising:
   a substrate layer;
   a buffer layer arranged on the substrate layer;
   a barrier layer arranged on the buffer layer;
   a drain arranged on the barrier layer;
   a gate arranged on the barrier layer;
   a source arranged on the barrier layer;
   the source and the drain being configured such that an electric current flows between the source and the drain via a two-dimensional electron gas (2DEG) induced at an heterointerface between the buffer layer and the barrier layer when the gate is biased at an appropriate level; and
   a p-type material layer arranged on the substrate layer below the barrier layer and the p-type material layer having a length parallel to a surface of the substrate layer over which the buffer layer is provided, the length of the p-type material layer parallel to the surface of the substrate layer extends at least from the source toward the gate such that the p-type material layer is not located at least along a vertical axis of the drain perpendicular to the surface of the substrate layer, wherein the p-type material layer extends 0% to 20%, 20% to 40%, 40% to 60%, or 60% to 80% of a gate length past a proximal edge of the gate; and wherein the proximal edge of the gate is located on the barrier layer and on a source side of the gate.

2. The high-electron mobility transistor of claim 1, wherein the length of the p-type material layer is configured and structured to increase discharge efficiency and limit breakdown.

3. The high-electron mobility transistor of claim 1, wherein the length of the p-type material layer is configured and structured to retard an electric field, to increase electron confinement, and decrease leakage.

4. The high-electron mobility transistor of claim 1, further comprising:
a plurality of unit cells; and
the plurality of unit cells comprising a plurality of the gate, a plurality of the source, and a plurality of the drain.

5. The high-electron mobility transistor of claim 1, further comprising:
a p-type material contact arranged on and electrically coupled to the p-type material layer; and
a nucleation layer arranged on the substrate layer and the buffer layer is arranged on the nucleation layer,
wherein the substrate layer comprises Gallium Nitride; and
wherein the length of the p-type material layer is configured and structured parallel to the surface of the substrate layer to extend 0% to 50% of a distance between the gate and the drain.

6. The high-electron mobility transistor of claim 1, further comprising:
a recess in at least the barrier layer;
the source comprises a p-type material contact arranged in the recess; and
the p-type material contact is arranged on and electrically coupled to the p-type material layer.

7. The high-electron mobility transistor of claim 1, wherein the gate comprises a metal patterned to extend across a spacer layer such that a top of the gate forms a field plate arranged to extend a distance away from an edge of the gate towards the drain.

8. The high-electron mobility transistor of claim 1, further comprising:
a second buffer layer arranged on the buffer layer on a side of the buffer layer opposite of the substrate layer,
wherein the barrier layer is arranged on the second buffer layer on a side opposite of the buffer layer.

9. A process of making high-electron mobility transistor comprising:
providing a substrate layer;
arranging a buffer layer on the substrate layer;
arranging a barrier layer arranged on the buffer layer;
arranging a source on the barrier layer;
arranging a drain on the barrier layer;
arranging a gate on the barrier layer;
configuring the source and the drain such that an electric current flows between the source and the drain via a two-dimensional electron gas (2DEG) induced at an heterointerface between the buffer layer and the barrier layer when the gate is biased at an appropriate level; and arranging a p-type material layer on the substrate layer below the barrier layer and the p-type material layer having a length parallel to a surface of the substrate layer over which the buffer layer is provided, the length of the p-type material layer parallel to the surface of the substrate layer extends at least from the source toward the gate such that the p-type material layer is not located at least along a vertical axis of the drain perpendicular to the surface of the substrate layer, wherein the p-type material layer extends 0% to 20%, 20% to 40%, 40% to 60%, or 60% to 80% of a gate length past a proximal edge of the gate; and wherein the proximal edge of the gate is located on the barrier layer and on a source side of the gate.

10. The process of making high-electron mobility transistor of claim 9, further comprising configuring and structuring the length of the p-type material layer to increase discharge efficiency and limit breakdown.

11. The process of making high-electron mobility transistor of claim 9, further comprising configuring and structuring the length of the p-type material layer to retard an electric field, to increase electron confinement, and decrease leakage.

12. The process of making high-electron mobility transistor of claim 9, further comprising providing a plurality of unit cells comprising a plurality of the gate, a plurality of the source, and a plurality of the drain.

13. The process of making high-electron mobility transistor of claim 9, further comprising:
arranging p-type material contact on and electrically coupled to the p-type material layer; and
arranging a nucleation layer on the substrate layer and the buffer layer is arranged on the nucleation layer,
wherein the substrate layer comprises Gallium Nitride; and
wherein the length of the p-type material layer is configured and structured parallel to the surface of the substrate layer to extend 0% to 50% of a distance between the gate and the drain.

14. The process of making high-electron mobility transistor of claim 9, further comprising:
forming a recess in at least the barrier layer; and
forming a source that comprises a portion having a p-type material contact arranged in the recess and the portion having the p-type material contact arranged on and electrically coupled to the p-type material layer; and
arranging the p-type material contact on and electrically coupled to the p-type material layer.

15. The process of making high-electron mobility transistor of claim 9, wherein the gate comprises a metal patterned to extend across a spacer layer such that a top of the gate forms a field plate arranged to extend a distance away from an edge of the gate towards the drain.

16. The process of making high-electron mobility transistor of claim 9, further comprising:
providing a second buffer layer formed on the buffer layer;
providing a protective layer formed on the barrier layer; and
providing a nucleation layer arranged on the substrate layer,
wherein the length of the p-type material layer is configured and structured parallel to the surface of the buffer layer to extend at least from the source past the gate and the p-type material layer is not located at least along a vertical axis of the drain perpendicular to the surface of the buffer layer.

17. The process of making high-electron mobility transistor of claim 9, further comprising:
forming a nucleation layer on the substrate layer and arranging the buffer layer on the nucleation layer,
wherein the substrate layer comprises Silicon Carbide.

18. The process of making high-electron mobility transistor of claim 9, further comprising:
forming a protective layer;
arranging a gate in part on the barrier layer and in part on the protective layer; and
forming a field plate structure extending a distance away from an edge of the gate.

19. The high-electron mobility transistor of claim 1, wherein the p-type material layer extends to a point within about 0 to about 0.3 µm of a proximal edge of the gate; and wherein the proximal edge of the gate is located on the barrier layer and on a source side of the gate.

20. The high-electron mobility transistor of claim 1, wherein the p-type material layer extends to a proximal edge of the gate; and wherein the proximal edge of the gate is located on the barrier layer and on a source side of the gate.

21. The high-electron mobility transistor of claim 1, wherein the p-type material layer extends 0% to 20% of a gate length past a proximal edge of the gate; and wherein the proximal edge of the gate is located on the barrier layer and on a source side of the gate.

22. The high-electron mobility transistor of claim 1, wherein the p-type material layer extends 20% to 40% of a gate length past a proximal edge of the gate; and wherein the proximal edge of the gate is located on the barrier layer and on a source side of the gate.

23. The high-electron mobility transistor of claim 1, wherein the p-type material layer extends 40% to 60% of a gate length past a proximal edge of the gate; and wherein the proximal edge of the gate is located on the barrier layer and on a source side of the gate.

24. The high-electron mobility transistor of claim 1, wherein the p-type material layer extends 60% to 80% of a gate length past a proximal edge of the gate; and wherein the proximal edge of the gate is located on the barrier layer and on a source side of the gate.

25. The high-electron mobility transistor of claim 5, wherein the p-type material contact comprises at least one metal overlayer.

26. The process of making high-electron mobility transistor of claim 9, wherein the p-type material layer extends to a point within about 0 to about 0.3 µm of a proximal edge of the gate; and wherein the proximal edge of the gate is located on the barrier layer and on a source side of the gate.

27. The process of making high-electron mobility transistor of claim 9, wherein the p-type material layer extends to a proximal edge of the gate; and wherein the proximal edge of the gate is located on the barrier layer and on a source side of the gate.

28. The process of making high-electron mobility transistor of claim 9, wherein the p-type material layer extends 0% to 20% of a gate length past a proximal edge of the gate; and wherein the proximal edge of the gate is located on the barrier layer and on a source side of the gate.

29. The process of making high-electron mobility transistor of claim 9, wherein the p-type material layer extends 20% to 40% of a gate length past a proximal edge of the gate; and wherein the proximal edge of the gate is located on the barrier layer and on a source side of the gate.

30. The process of making high-electron mobility transistor of claim 9, wherein the p-type material layer extends 40% to 60% of a gate length past a proximal edge of the gate; and wherein the proximal edge of the gate is located on the barrier layer and on a source side of the gate.

31. The process of making high-electron mobility transistor of claim 9, wherein the p-type material layer extends 60% to 80% of a gate length past a proximal edge of the gate; and wherein the proximal edge of the gate is located on the barrier layer and on a source side of the gate.

32. The process of making high-electron mobility transistor of claim 13, wherein the p-type material contact comprises at least one metal overlayer.

* * * * *